(12) United States Patent
Song et al.

(10) Patent No.: US 11,011,493 B2
(45) Date of Patent: May 18, 2021

(54) BONDING AND PLACEMENT TOOLS FOR BONDING MACHINES, BONDING MACHINES FOR BONDING SEMICONDUCTOR ELEMENTS, AND RELATED METHODS

(71) Applicant: Kulicke and Soffa Industries, Inc., Fort Washington, PA (US)

(72) Inventors: Ai Jun Song, Jamison, PA (US); Daniel P. Buergi, Berg (CH); Horst Clauberg, Warwick, PA (US); Matthew E. Tarabulski, Horsham, PA (US); Matthew B. Wasserman, Philadelphia, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 273 days.

(21) Appl. No.: 16/150,362

(22) Filed: Oct. 3, 2018

(65) Prior Publication Data
US 2019/0164931 A1 May 30, 2019

Related U.S. Application Data

(60) Provisional application No. 62/591,832, filed on Nov. 29, 2017.

(51) Int. Cl.
*B23K 3/04* (2006.01)
*H01L 23/00* (2006.01)
(Continued)

(52) U.S. Cl.
CPC ............ *H01L 24/83* (2013.01); *B23K 1/0016* (2013.01); *B23K 3/04* (2013.01); *B23K 3/047* (2013.01);
(Continued)

(58) Field of Classification Search
CPC . B23K 3/00; B23K 3/027; B23K 3/04; B23K 3/047; B23K 3/0471; B23K 2101/40; B23K 2103/56; B23K 1/0012; B23K 1/0016; B23K 1/008; H05K 2201/10674; H01L 2924/00012; H01L 2924/00014; H01L 2924/0002; H01L 2924/014; H01L 2924/351; H01L 24/10; H01L 24/13; H01L 24/16; H01L 24/29; H01L 24/32; H01L 24/73; H01L 24/743; H01L 24/75; H01L 24/79; H01L 24/81; H01L 24/83; H01L 24/92; H01L 2224/13101;
(Continued)

(56) References Cited

U.S. PATENT DOCUMENTS

| 5,653,376 A * | 8/1997 | Nakamura | B23K 20/025 |
| | | | 228/44.7 |
| 2007/0193533 A1* | 8/2007 | Kanda | F22B 1/28 |
| | | | 122/4 A |

FOREIGN PATENT DOCUMENTS

JP         7-302818 A    * 11/1995

* cited by examiner

*Primary Examiner* — Hung D Nguyen
(74) *Attorney, Agent, or Firm* — Christopher M. Spletzer, Sr.

(57) ABSTRACT

A bonding tool for bonding a semiconductor element to a substrate on a bonding machine is provided. The bonding tool includes a body portion including a contact region for contacting the semiconductor element during a bonding process on the bonding machine. The body portion defines a non-contact region adjacent the contact region. The bonding tool also includes a heat resistant coating applied to the non-contact region.

20 Claims, 8 Drawing Sheets

(51) Int. Cl.
*B23K 3/047* (2006.01)
*B23K 1/00* (2006.01)
B23K 101/40 (2006.01)
B23K 103/00 (2006.01)

(52) U.S. Cl.
CPC .......... H01L 24/75 (2013.01); *B23K 2101/40* (2018.08); *B23K 2103/56* (2018.08); *H01L 24/13* (2013.01); *H01L 24/81* (2013.01); *H01L 2224/13101* (2013.01); *H01L 2224/75252* (2013.01); *H01L 2224/75302* (2013.01); *H01L 2224/75312* (2013.01); *H01L 2224/75745* (2013.01); *H01L 2224/81203* (2013.01); *H01L 2224/81815* (2013.01); *H01L 2224/83203* (2013.01); *H05K 2201/10674* (2013.01)

(58) Field of Classification Search
CPC . H01L 2224/73204; H01L 2224/75302; H01L 2224/75252; H01L 2224/75301; H01L 2224/75312; H01L 2224/75502; H01L 2224/75702; H01L 2224/75745; H01L 2224/75981; H01L 2224/81203; H01L 2224/81815; H01L 2224/83191; H01L 2224/83203
USPC ........... 219/78.01, 78.02, 85.16, 85.19, 85.2, 219/85.21, 85.1, 85.14
See application file for complete search history.

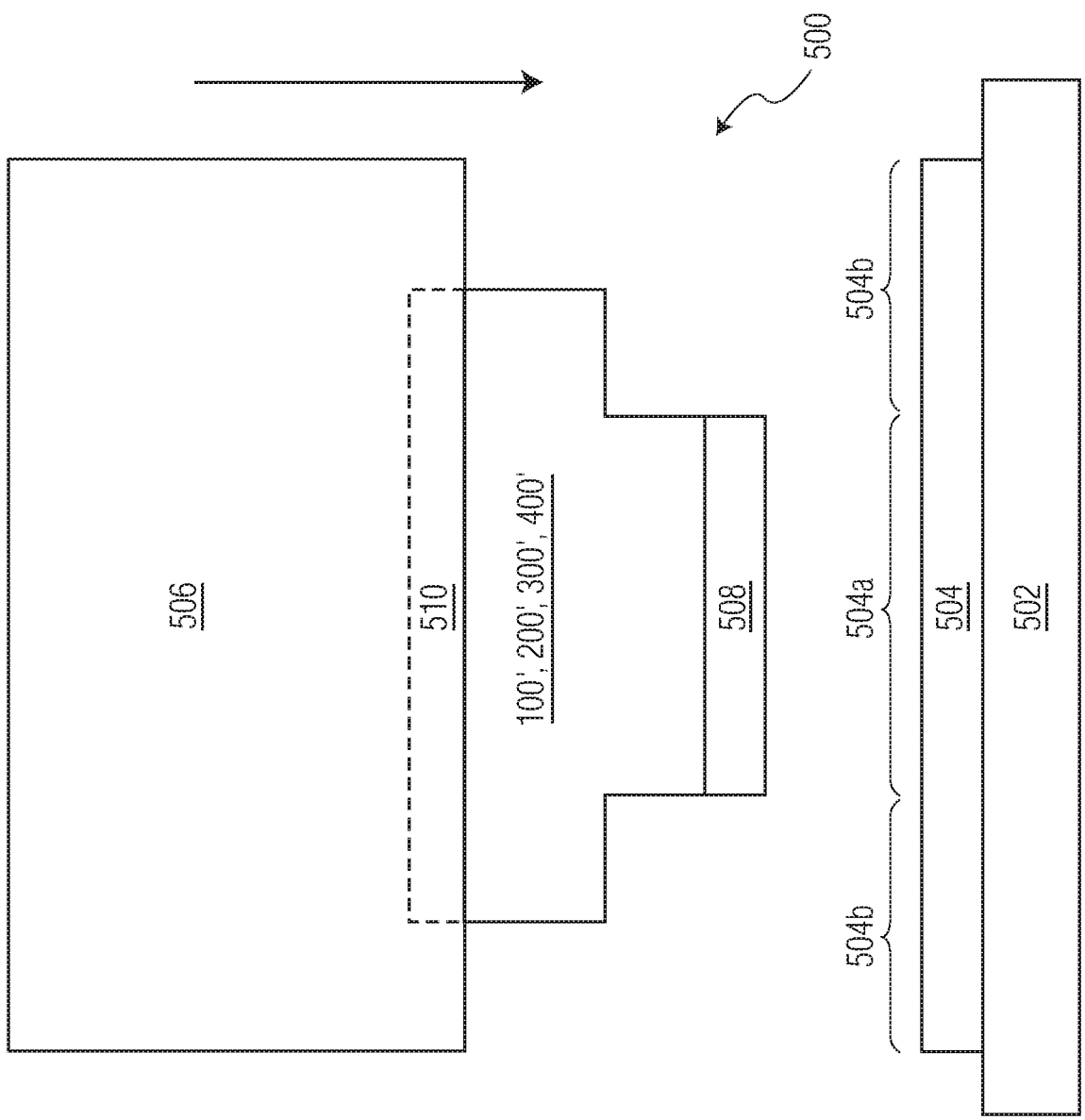

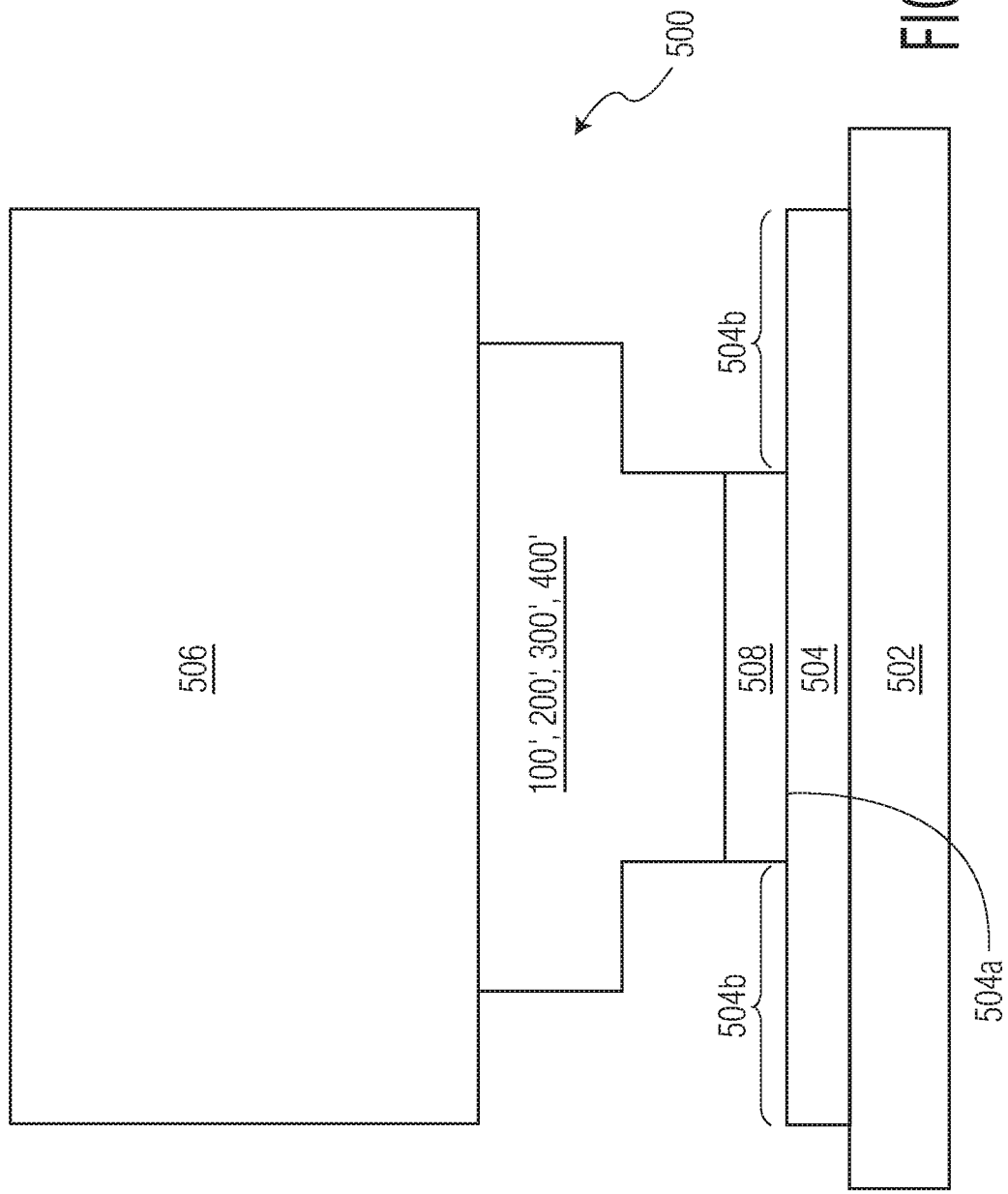

BONDING AND PLACEMENT TOOLS FOR BONDING MACHINES, BONDING MACHINES FOR BONDING SEMICONDUCTOR ELEMENTS, AND RELATED METHODS

CROSS-REFERENCE

This application claims the benefit of U.S. Provisional Patent Application No. 62/591,832 filed Nov. 29, 2017, the contents of which is incorporated herein by reference.

FIELD

The present invention relates to the formation of semiconductor packages, and more particularly, to improved bonding/placement tools for use in connection with bonding machines for bonding semiconductor elements.

BACKGROUND

In certain aspects of the semiconductor packaging industry, semiconductor elements are bonded to bonding locations. For example, in conventional die attach (also known as die bonding) applications, a semiconductor die is bonded to a bonding location of a substrate (e.g., a leadframe, another die in stacked die applications, a spacer, etc.). In advanced packaging applications, semiconductor elements (e.g., bare semiconductor die, packaged semiconductor die, etc.) are bonded to bonding locations of a substrate (e.g., a leadframe, a PCB (printed circuit board), a carrier, a semiconductor wafer, a BGA (ball grid array) substrate, etc.), with conductive structures (e.g., conductive bumps, contact pads, solder bumps, conductive pillars, copper pillars, etc.) providing electrical interconnection between the semiconductor element and the bonding location.

In many applications (e.g., thermocompression bonding of semiconductor elements), the bonding tool (sometimes referred to as a placement tool or a placer tool) used to bond the semiconductor elements to a substrate is heated. Heat from the bonding tool may reach portions of the substrate not presently being bonded. Such heat may undesirably affect the characteristics of such portions of the substrate, and ultimately, the bonding process.

Thus, it would be desirable to provide improved bonding tools, bonding machines, and methods of processing such bonding tools.

SUMMARY

According to an exemplary embodiment of the invention, a bonding tool for bonding a semiconductor element to a substrate on a bonding machine is provided. The bonding tool includes a body portion including a contact region for contacting the semiconductor element during a bonding process on the bonding machine. The body portion defines a non-contact region adjacent the contact region. The bonding tool also includes a heat resistant coating applied to the non-contact region.

According to another exemplary embodiment of the invention, a bonding machine for bonding a semiconductor element to a substrate is provided. The bonding machine includes a bonding tool. The bonding tool includes a body portion including a contact region for contacting the semiconductor element during a bonding process on the bonding machine. The body portion defines a non-contact region adjacent the contact region. The bonding tool also includes a heat resistant coating applied to the non-contact region. The bonding machine also includes a support structure for supporting the substrate.

According to yet another exemplary embodiment of the invention, a method of processing a bonding tool is provided. The method includes: (a) providing a bonding tool, the bonding tool including a body portion including a contact region for contacting a semiconductor element during a bonding process on a bonding machine, the body portion defining a non-contact region adjacent the contact region; and (b) applying a heat resistant coating to the non-contact region.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 5A-5C are block diagram side views of a bonding machine in accordance with an exemplary embodiment of the invention;

DETAILED DESCRIPTION

Figure 1A:
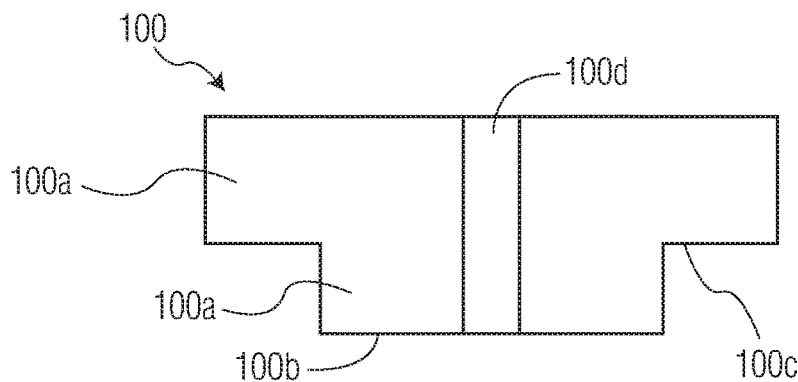
FIGS. 1A-1C are block diagram side sectional views of a bonding tool in accordance with an exemplary embodiment of the invention.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a semiconductor element may be bonded (e.g., thermocompressively bonded, ultrasonically bonded, thermosonically bonded, die bonded, etc.). Exemplary substrates include, for example, a leadframe, a PCB, a carrier, a semiconductor chip, a semiconductor wafer, a BGA substrate, a semiconductor element, etc.

In accordance with aspects of the invention, heat resistant coatings and other coatings are described. Such heat resistant coatings may further be characterized as including a low heat emissivity material and/or a low thermal conductivity material. Emissivity is defined as a ratio of the thermal radiation from a surface, to the radiation from an ideal black surface at the same temperature, as given by the Stefan-Boltzmann law. Emissivity is generally described by a ratio varying from 0 to 1. "Low" heat emissivity, as used herein, refers to an emissivity of <0.5 (e.g., within a range of 0.02 to 0.5). Exemplary thicknesses of the heat resistant coatings and other coatings may be <100 micrometers, <50 micrometers, <20 micrometers, and <10 micrometers. "Low" thermal conductivity, as used herein, refers to a thermal conductivity of <3 W/mK.

In accordance with aspects of the invention, coatings/materials are provided with a bonding tool in selected areas where heat transfer to a substrate is not desired, so as to reduce such undesirable heat transfer to the substrate. Typically, a heated bonding tool is formed of a material having a high level of heat conductivity such that heat may be transferred to the bonding component (e.g., semiconductor element) to be bonded using the bonding tool.

The bonding tool may be a heated bonding tool (e.g., the heater and the bonding tool are integrated into one component). In other examples, a heater separate (also referred to as "distinct") from the bonding tool may be provided.

With or without an integrated heater, the bonding tool may be formed from one piece of material, or several pieces of material. The exemplary bonding tools shown, for example, in FIGS. 1A-1D, FIGS. 2A-2B, FIGS. 3A-3D, and FIGS. 4A-4C may be used to illustrate bonding tools formed from one piece of material, or several pieces of material. In one specific example, a bonding tool may include two portions. An upper portion for contacting a heater (e.g., a pulse heater, in an embodiment where the heater is separate from the tool), and a lower portion for contacting the bonding component (e.g., semiconductor element) to be bonded. In such a specific example, the upper portion dimension may be determined by reference to the pulse heater size, and the lower portion dimension may be determined by reference to the component size.

Bonding tools according to the invention may define one or more vacuum paths that provide vacuum used to hold the bonding component (e.g., for vision alignment, for flux dipping, for touch down processes, etc.).

Bonding tools according to the invention may be used in connection with a bonding machine (e.g., a thermocompression bonding (TCB) machine, a flip chip bonding machine, a conventional die attach machine, etc.). In connection with a thermocompression bonding machine, the bonding tool may refer to a part that can be attached onto the pulse heater (in an embodiment where the heater is separate from the tool). The bonding tool may sometimes be referred to as a collet, a die collet, a placement tool, a placer tool, among other names, depending on the application.

In a TCB process, the bonding tool places and bonds a semiconductor element (e.g., a die or interposer) to a substrate (e.g., any type of substrate such as a chip, a wafer, etc.) by in-situ melting and re-solidifying solder bumps on the die being placed. Heat is typically applied from the die side only while the substrate is maintained at a low stage temperature, as opposed to isothermal heating in mass reflow. The TCB heater used for bonding typically has a fast ramp up rate and a larger size (footprint) as compared to the die (or other semiconductor element) being bonded. In such a case, a portion of the heater (or a heated part of the bonding tool) may be positioned above areas of the substrate not presently being bonded (e.g., adjacent unbonded pads) (e.g., see areas 504b FIG. 5A). Heat radiated from the heater/bonding tool to those unbonded pads (or other areas of the substrate not presently being bonded) (where such unbonded pads or other areas not presently being bonded may collectively be referred to herein as "non-bonding" areas) may significantly affect pad metallization and/or substrate pre-applied materials (e.g., nonconductive pastes, fluxes, nonconductive films, anisotropic conductive films, etc.). Reducing the heat radiation to those unbonded pads may be desirable for a more robust, more reliable TCB process.

In certain exemplary embodiments of the invention, a heat resistant coating is provided on the bonding tool non-contact region which would be positioned above the adjacent pads (or other areas not presently being bonded). This heat resistant coating may desirably have a low heat emissivity and/or a low thermal conductivity, for reducing the heat radiation and/or conduction from a warm bonding tool to the adjacent bond pad or other areas not being bonded.

Referring now to the drawings, FIG. 1A illustrates a bonding tool (placement tool) 100. Bonding tool 100 may be formed, for example, using a high heat conductivity material such as aluminum nitride ceramic material. Of course, other materials are contemplated for bonding tool 100 (and other tools within the scope of the invention). Bonding tool 100 includes a body portion 100a. Body portion 100a includes a contact surface/region 100b for contacting a semiconductor element (not shown, but see FIGS. 5A-5C) during a bonding process. Body portion 100a also includes a non-contact region 100c adjacent contact surface/region 100b. In the example shown in FIG. 1A, non-contact region 100c is stepped portion 100c, that is, portion 100c is "stepped" upward (or downward depending on one's perspective) as compared to contact surface/region 100b. Body portion 100a also defines one or more vacuum holes 100d which are used to hold the semiconductor element (not shown) using vacuum.

Figure 1B:
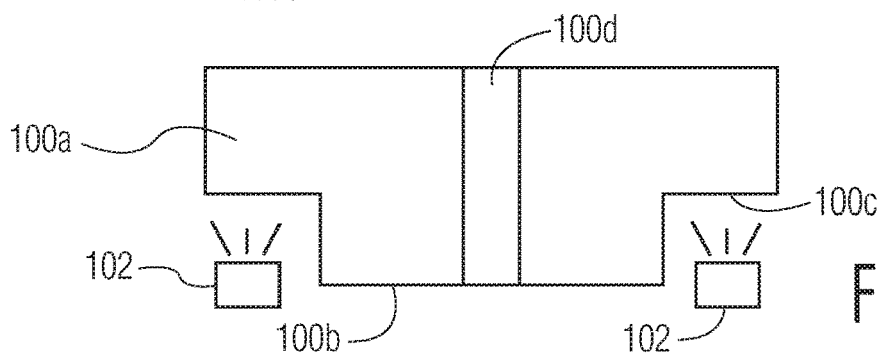
Figure 1C:
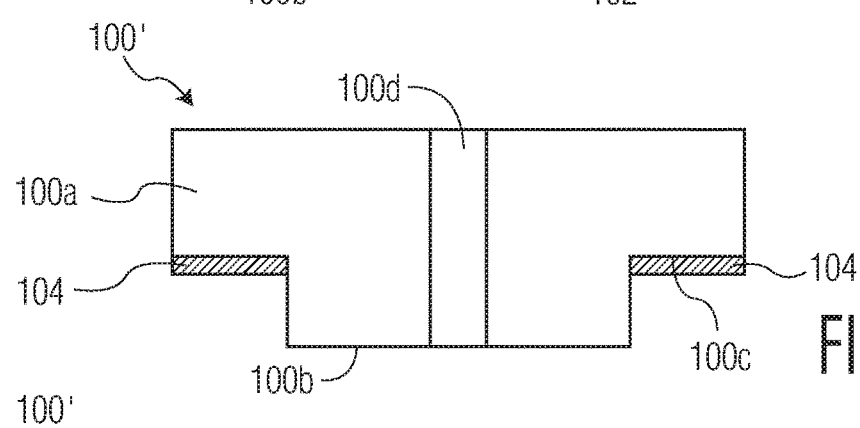

FIG. 1B illustrates sputtering nozzle(s) 102 configured to sputter a low heat emissivity material (e.g., a low heat emissivity metallization layer), for example, onto stepped portion 100c. After the sputtering (or other application process) is complete, FIG. 1C illustrates bonding tool 100' (tool 100 is now referred to as tool 100' because of the inclusion of heat resistant coating 104). Heat resistant coating 104, in the example shown in FIG. 1C, is low heat emissivity layer 104 provided on stepped portion 100c. Of course, different systems (other than sputtering nozzles) may be used to apply the low heat emissivity material onto stepped (non-contact) portion 100c.

Figure 1D:
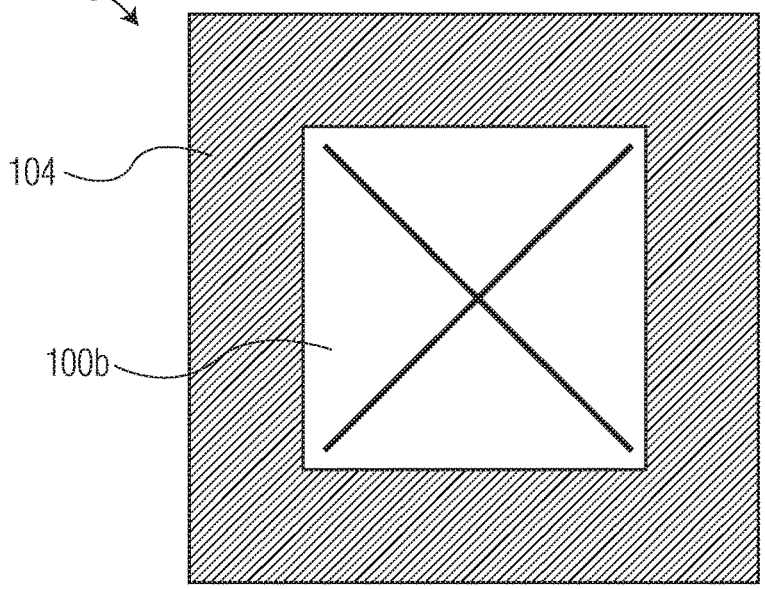
FIG. 1D is a bottom view of the bonding tool of FIG. 1C.

FIG. 1D is a bottom view of bonding tool 100' including low heat emissivity layer 104 surrounding contact surface 100b.

Figure 2A:
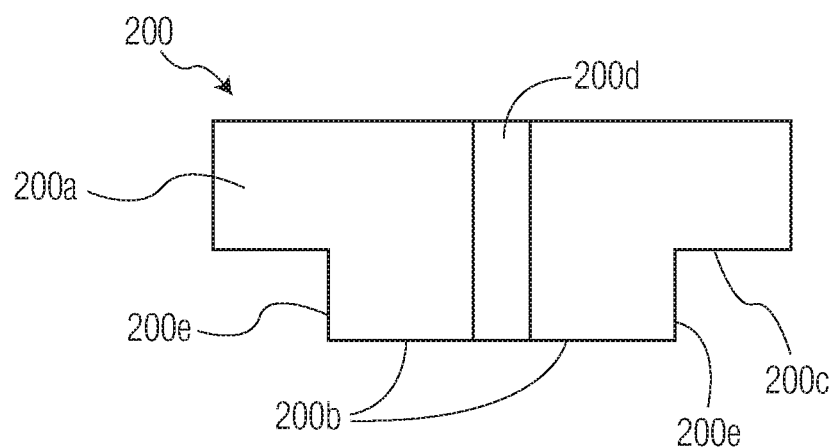
FIGS. 2A-2B are block diagram side sectional views of another bonding tool in accordance with another exemplary embodiment of the invention.
Figure 2B:
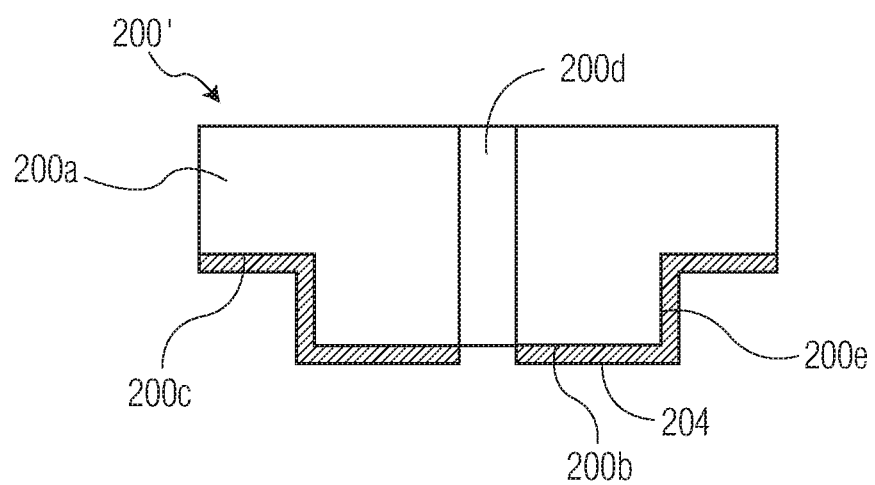

FIGS. 1A-1D illustrate just one example of a heat resistant coating (a single layer of low emissivity material) applied using one technique (e.g., sputtering). However, it is understood that other types of heat resistant coatings may be provided, and such coatings may be applied in a number of ways (e.g., sputtering, electro-plating, ink jet printing, spraying, painting, etc.). FIGS. 2A-2B illustrate another example.

FIGS. 2A-2B illustrate a further exemplary embodiment of the invention with bonding/placement tool 200 substantially similar to bonding tool 100 in connection with FIGS. 1A-1D. As illustrated in FIG. 2A, bonding tool 200 includes a body portion 200a. Body portion 200a includes a contact surface/portion 200b for contacting a semiconductor element (not shown) during a bonding process. Body portion 200a also includes a non-contact region 200c adjacent contact surface/region 200b. In the example shown in FIG. 2A, non-contact region 200c is a stepped portion 200c, that is, portion 200c is "stepped" upward (or downward depending on one's perspective) as compared to contact surface/region 200b. Side walls 200e connect contact portion 200b and non-contact portion 200c. Body portion 200a also defines one or more vacuum holes 200d which are used to hold the semiconductor element (not shown) using vacuum.

FIG. 2B illustrates an insulating layer/heat resistant coating (e.g., a low thermal conductivity layer) 204 having been applied (e.g., using sputtering or another technique) to stepped, non-contact, portion 200c, contact portion 200b, and vertical side walls 200e of bonding tool 200' (bonding tool 200 is now referred to as bonding tool 200' because of the inclusion of layer 204). Thus, in the example shown in FIGS. 2A-2B, an insulating layer/heat resistant coating is applied over the entire lower exposed surfaces of body portion 200a, that is over stepped, non-contact, portion 200c, over contact portion 200b, and over vertical side walls 200e of bonding tool 200'.

Figure 3A:
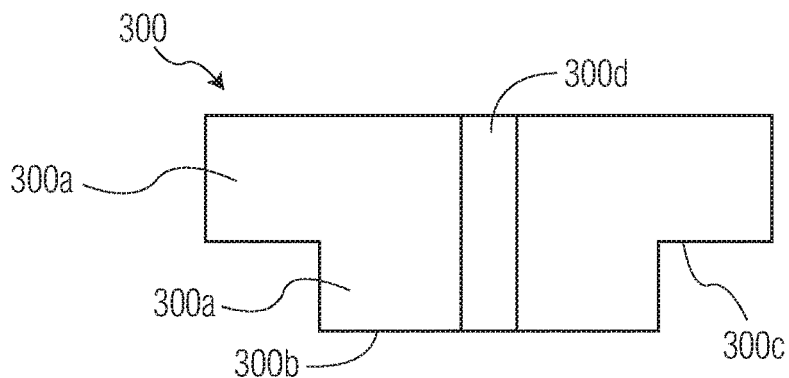
FIGS. 3A-3C are block diagram side sectional views of yet another bonding tool in accordance with yet another exemplary embodiment of the invention.

FIG. 3A illustrates a bonding tool (placement tool) 300 that is substantially similar to bonding tool 100 shown in FIG. 1A. Bonding tool 300 includes body portion 300a. Body portion 300a includes contact surface/region 300b for contacting a semiconductor element (not shown) during a bonding process. Body portion 300a also includes non-contact region 300c adjacent contact surface/region 300b. In the example shown in FIG. 3A, non-contact region 300c is a stepped portion 300c, that is, portion 300c is "stepped" upward (or downward depending on one's perspective) as compared to contact surface/region 300b. Body portion 300a also defines one or more vacuum holes 300d which are used to hold the semiconductor element (not shown) using vacuum.

Figure 3B:
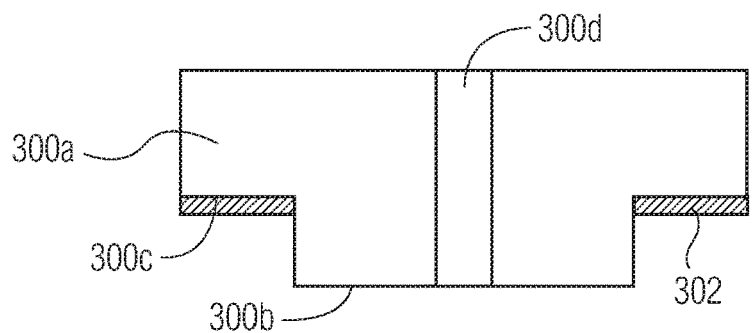
Figure 3C:
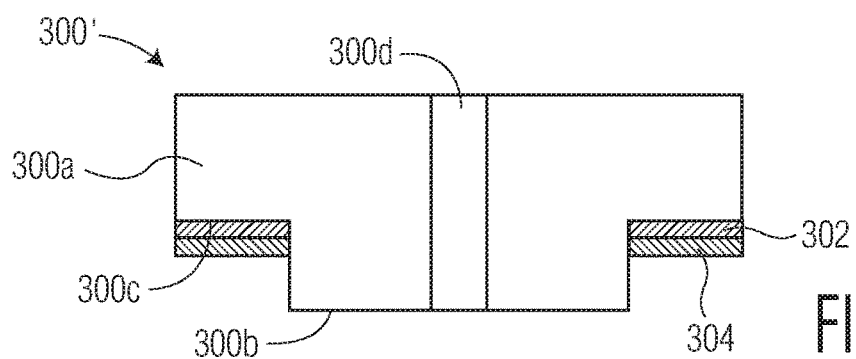
Figure 3D:
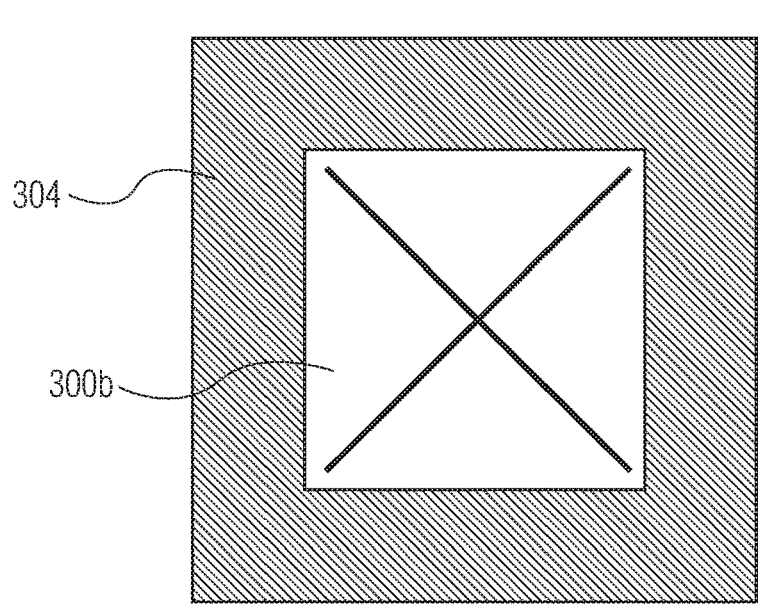
FIG. 3D is a bottom view of the bonding tool of FIG. 3C.

FIG. 3B illustrates an insulating layer (e.g., a low thermal conductivity layer) 302 having been applied (e.g., by sputtering or some other technique) to stepped portion 300c. FIG. 3C illustrates a low heat emissivity layer 304 applied (e.g., by sputtering or some other technique) over insulating layer 302. FIG. 3C illustrates bonding tool 300' (bonding tool 300 is now referred to as bonding tool 300' because of the inclusion of insulating layer 302 and low heat emissivity layer 304). Thus, in the example shown in FIGS. 3A-3C, a multi-layer heat resistant coating (including insulating layer 302 and low heat emissivity layer 304) is applied in a number of steps. FIG. 3D is a bottom view of bonding tool 300' including low heat emissivity layer 304 surrounding contact surface 300b (with insulating layer 302 beneath low heat emissivity layer 304, and not visible in FIG. 3D).

Figure 4A:
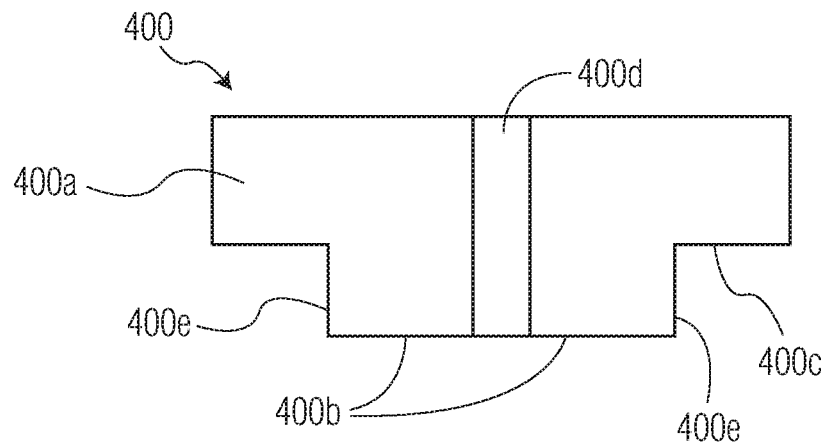
FIGS. 4A-4C are block diagram side sectional views of yet another bonding tool in accordance with yet another exemplary embodiment of the invention.
Figure 4B:
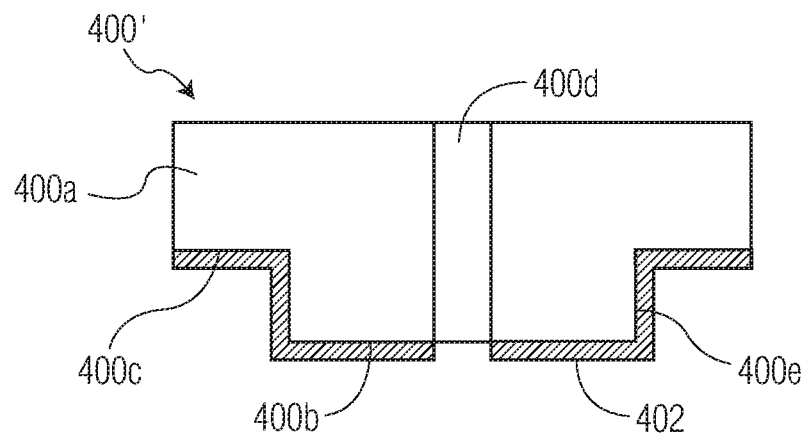
Figure 4C:
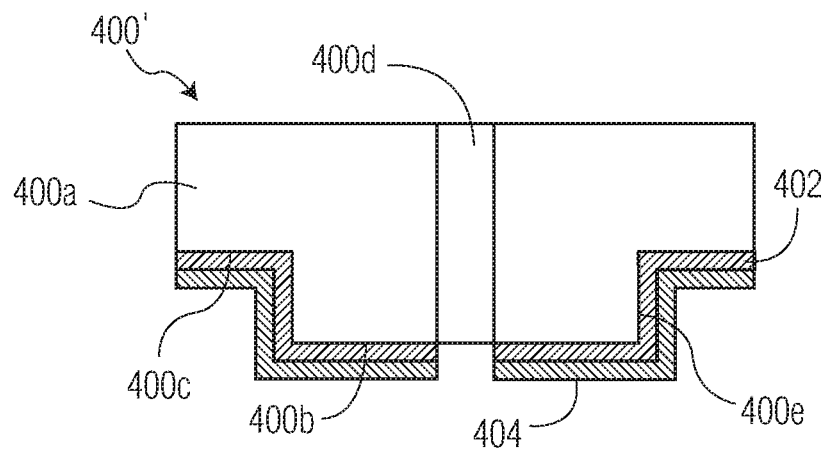

FIGS. 4A-4C illustrate a further exemplary embodiment of the invention with bonding/placement tool 400 substantially similar to bonding tool 300 in FIGS. 3A-3D. FIG. 4A illustrates a bonding tool (placement tool) 400 that is also substantially similar to bonding tool 200 shown in FIG. 2A. Bonding tool 400 includes a body portion 400a. Body portion 400a includes a contact surface/region 400b for contacting a semiconductor element (not shown) during a bonding process. Body portion 400a also includes a non-contact region 400c adjacent contact surface/region 400b. In the example shown in FIG. 4A, non-contact region 400c is a stepped portion 400c, that is, portion 400c is "stepped" upward (or downward depending on one's perspective) as compared to contact surface/region 400b. Side walls 400e connect contact portion 400b and non-contact portion 400c.

Body portion 400a also defines one or more vacuum holes 400d which are used to hold the semiconductor element (not shown) using vacuum.

FIG. 4B illustrates an insulating layer (e.g., a low thermal conductivity layer) 402 having been applied (e.g., by sputtering or some other technique) to stepped, non-contact portion 400c, contact portion 400b, and side walls 400e of bonding tool 400. FIG. 4C illustrates a low heat emissivity layer 404 applied (e.g., by sputtering or some other technique) over insulating layer 402. FIG. 4C illustrates bonding tool 400' (bonding tool 400 is now referred to as bonding tool 400' because of the inclusion of insulating layer 402 and low heat emissivity layer 404). Thus, in the example shown in FIGS. 4A-4C, a multi-layer heat resistant coating (including insulating layer 402 and low heat emissivity layer 404) is applied in a number of steps.

Figure 5C:
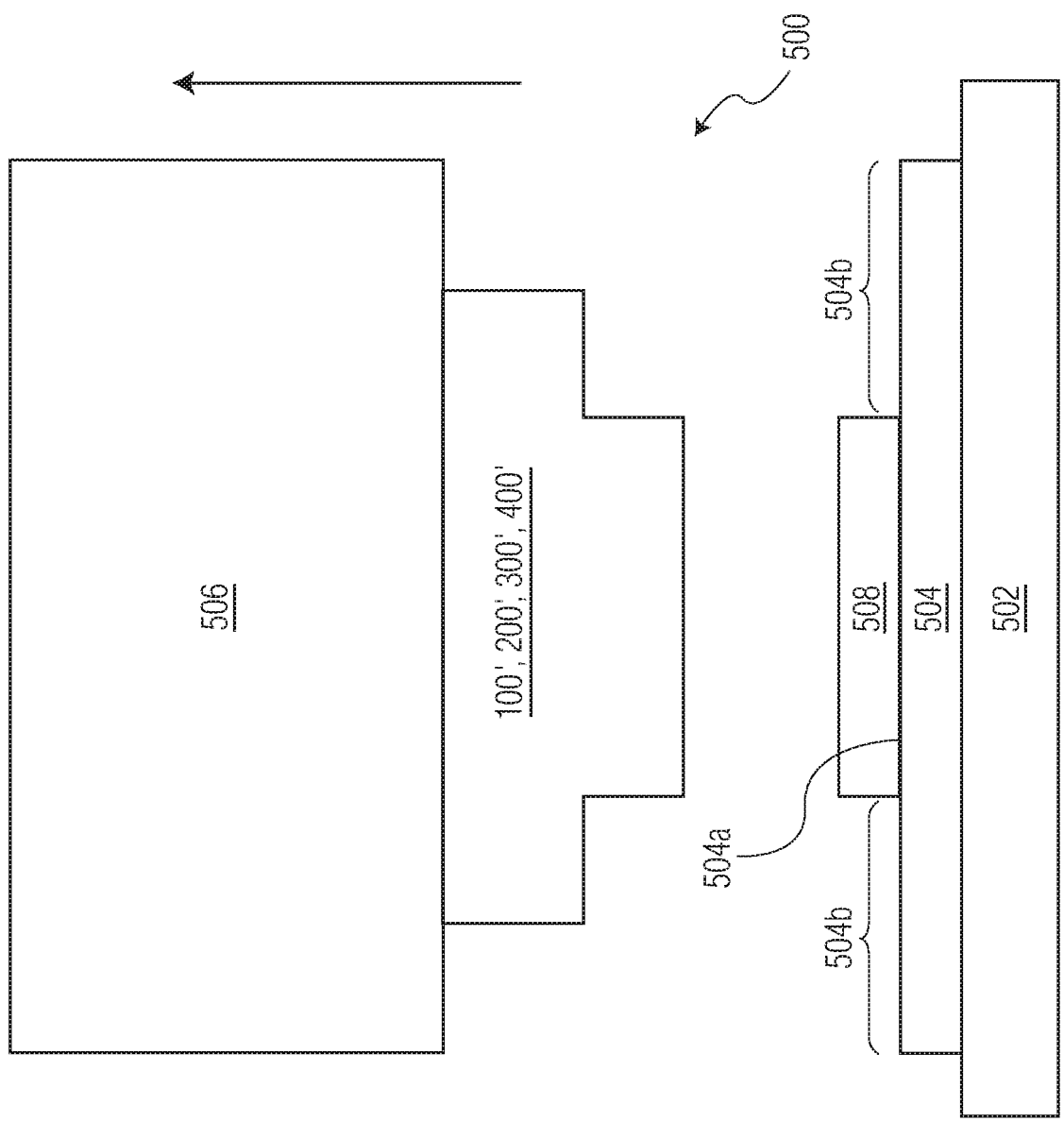

FIG. 5A illustrates a bonding machine 500 (e.g., a thermocompression bonding machine) including support structure 502 (e.g., a bond chuck) for supporting substrate 504. Bonding machine 500 also includes bond head 506 for carrying bonding tool (placement tool) 100', 200', 300', 400'. That is, the bonding tool carried by bond head 506 may be bonding tool 100' from FIG. 1C, bonding tool 200' from FIG. 2B, bonding tool 300' from FIG. 3C, bonding tool 400' from FIG. 4C, or any other bonding tool within the scope of the invention. Bonding tool 100', 200', 300', 400' includes a respective contact surface/region, adjacent, stepped portions/non-contact regions, and sidewalls connecting them, as well as the relevant heat resistant coating (not shown in FIGS. 5A-5C, but see other drawings of bonding tools 100', 200', 300', and 400'). FIG. 5A also illustrates (in dotted lines, to make clear this is an optional feature) heater 510 independent of bonding tool 100', 200', 300', 400'. As mentioned above, bonding tool 100', 200', 300', 400' may alternatively include an integrated heater.

As illustrated in FIG. 5A, the contact surface/region of bonding tool 100', 200', 300', 400' is carrying chip 508 (a semiconductor element) configured to be bonded/placed onto bonding area 504a of substrate 504. Substrate 504 also includes adjacent non-bonding areas 504b. That is, non-bonding areas 504b are not being bonded with chip 508 shown in FIG. 5A. For example, non-bonding area 504b may be configured to receive another chip 508 and may include a flux film (or other material) affected by heat radiation from bonding tool 100', 200', 300', 400'. FIG. 5B illustrates chip 508 being bonded to bonding area 504a of substrate 504. Because of the inclusion of the heat resistant coating on: (a) the respective stepped portions/non-contact regions of bonding tool 100', 300' (not shown in FIG. 5B, but see FIGS. 1C and 3C, for example), or (b) the respective stepped portions/non-contact regions, contact regions and sidewalls connecting them, of bonding tool 200', 400' (not shown in FIG. 5B, but see FIGS. 2B and 4C, for example), non-bonding areas 504b of substrate 504 are not subjected to a certain amount of heat from bonding tool 100', 200', 300', 400'.

As illustrated in FIG. 5C, chip 508 has been bonded to bonding area 504a of substrate 504, and bond head 506 (with bonding tool 100', 200', 300', 400') has been raised from substrate 504. Because of the inclusion of the heat resistant coating on: (a) the respective stepped portions/non-contact regions of bonding tool 100', 300' (not shown in FIG. 5B, but see FIGS. 1C and 3C, for example), or (b) the respective stepped portions/non-contact regions, contact regions and sidewalls connecting them, of bonding tool 200', 400' (not shown in FIG. 5B, but see FIGS. 2B and 4C, for example), non-bonding areas 504b of substrate 504 are not subjected to a certain amount of heat from bonding tool 100', 200', 300', 400'.

Figure 6:
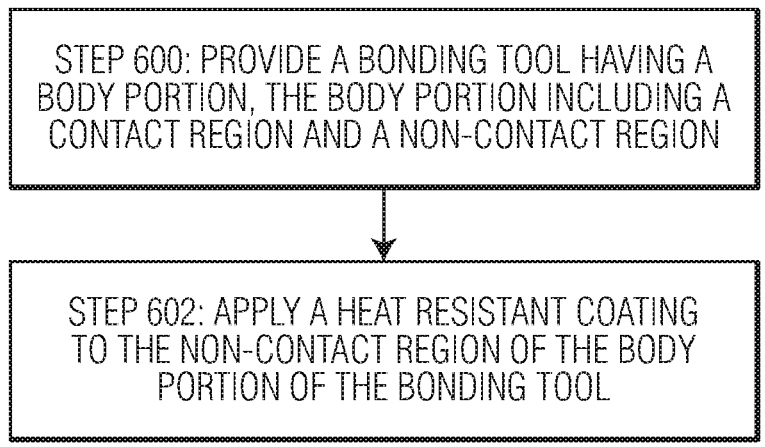
FIG. 6 is a flow diagram illustrating a method of processing a bonding tool in accordance with an exemplary embodiment of the invention.
Figure 7:
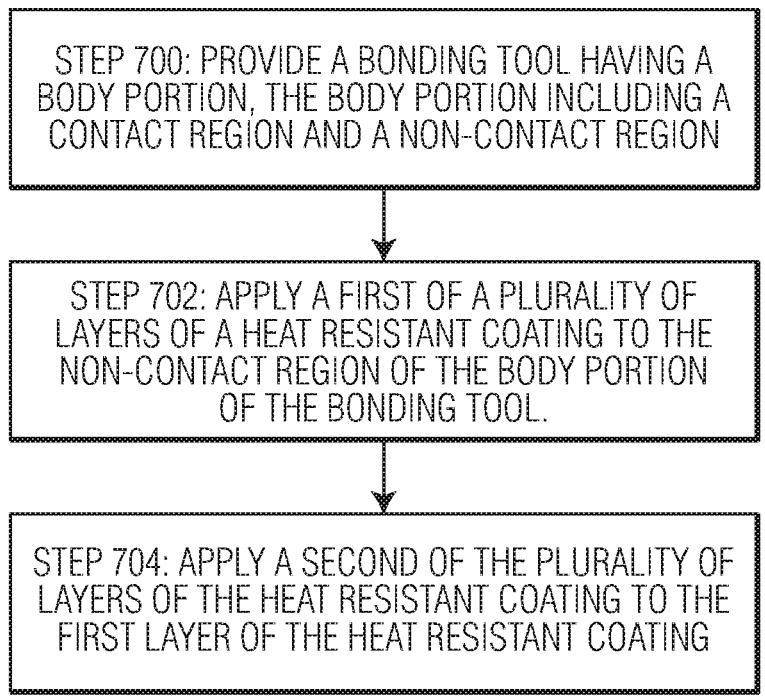
FIG. 7 is a flow diagram illustrating another method of processing a bonding tool in accordance with an exemplary embodiment of the invention.

FIGS. 6-7 are flow diagrams illustrating methods of processing bonding tools in accordance with various exemplary embodiments of the invention. As is understood by those skilled in the art, certain steps included in the flow diagrams may be omitted; certain additional steps may be added; and the order of the steps may be altered from the order illustrated.

Referring specifically to FIG. 6, at Step 600, a bonding tool (e.g., any of bonding tools 100, 200, 300, and 400 illustrated and described herein, or any other bonding tool within the scope of the invention) having a body portion is provided. The body portion includes a contact region and a non-contact region. At Step 602, a heat resistant coating is applied to the non-contact region (e.g., to reduce the amount of heat transmitted from the bonding tool to non-bonding areas of a substrate). For example, various heat resistant coatings (e.g., including one or more layers) are illustrated and described herein, as being applied to the non-contact region of the body portion (and sometimes applied to the contact region of the body portion as well).

Referring specifically to FIG. 7, at Step 700, a bonding tool (e.g., either of bonding tools 300 and 400 illustrated and described herein, or other bonding tools within the scope of the invention) having a body portion is provided. The body portion includes a contact region and a non-contact region. At Step 702, a first layer of a plurality of layers of a heat resistant coating is applied to the non-contact region. At Step 704, a second layer of the plurality of layers of the heat resistant coating is applied to the first layer of the heat resistant coating. Such a multi-layer heat resistant coating is applied to the non-contact region of the body portion to reduce the amount of heat transmitted from the bonding tool to non-bonding areas of a substrate. For example, various multi-layer heat resistant coatings have been illustrated and described herein (e.g., see FIGS. 3A-3D and FIGS. 4A-4C), as being applied to the non-contact region of the body portion (and sometimes applied to the contact region, and/or connecting sidewalls, of the body portion as well).

The heat resistant coatings described herein (and/or the low thermal conductivity layers/materials and the low heat emissivity layers/materials described herein) may be formed from any of a number of materials having such characteristics. For example, the heat resistant coating may be formed of, or include a metal such as gold, silver, tungsten, etc. In one specific example, the heat resistant coating may be a polished gold surface provided on the non-contact region of the body portion of the bonding tool (e.g., where the gold may have been applied using sputtering or other techniques). Another specific example coating is a titanium nitride (TiN) material applied, for example, using a CVD (i.e., chemical vapor deposition) process.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A bonding tool for bonding a semiconductor element to a substrate on a bonding machine, the bonding tool comprising:
    a body portion including a contact region for directly contacting the semiconductor element during a bonding process on the bonding machine, the body portion defining at least one vacuum hole to hold the semiconductor element using vacuum such that the bonding tool carries the semiconductor element to the substrate for bonding the semiconductor element to the substrate during the bonding process, the body portion defining a non-contact region adjacent the contact region; and
    a heat resistant coating applied to the non-contact region.

2. The bonding tool of claim 1 wherein the heat resistant coating includes a low heat emissivity material.

3. The bonding tool of claim 1 wherein the heat resistant coating includes a low thermal conductivity material.

4. The bonding tool of claim 1 wherein the heat resistant coating includes a plurality of layers.

5. The bonding tool of claim 4 wherein the plurality of layers includes a low heat emissivity layer and a low thermal conductivity layer.

6. The bonding tool of claim 5 wherein the low heat emissivity layer is provided on the low thermal conductivity layer.

7. The bonding machine of claim 1 wherein the heat resistant coating has an emissivity of between 0.02 and 0.5.

8. The bonding tool of claim 1 wherein the heat resistant coating is applied to the body portion using at least one of sputtering or electroplating.

9. The bonding tool of claim 1 wherein the heat resistant coating includes gold.

10. The bonding tool of claim 1 wherein the bonding tool is a placement tool for use in a thermocompression bonding operation on the bonding machine.

11. The bonding tool of claim 1 wherein the bonding tool is a heated bonding tool for heating the semiconductor element.

12. The bonding tool of claim 1 wherein the bonding tool is engaged with a distinct heater for heating the semiconductor element.

13. The bonding tool of claim 1 wherein the non-contact region is a stepped region.

14. The bonding tool of claim 1 wherein the heat resistant coating is also applied to the contact region.

15. A bonding machine for bonding a semiconductor element to a substrate, the bonding machine comprising:
    a bonding tool, the bonding tool including a body portion including a contact region for directly contacting the semiconductor element during a bonding process on the bonding machine, the body portion defining at least one vacuum hole to hold the semiconductor element using vacuum such that the bonding tool carries the semiconductor element to the substrate for bonding the semiconductor element to the substrate during the bonding process, the body portion defining a non-contact region adjacent the contact region, the bonding tool also including a heat resistant coating applied to the non-contact region; and
    a support structure for supporting the substrate.

16. The bonding machine of claim 15 further comprising a bond head assembly for carrying the bonding tool.

17. The bonding machine of claim 15 wherein the bonding tool is a placement tool for use in a thermocompression bonding operation on the bonding machine.

18. The bonding machine of claim 15 wherein the heat resistant coating includes a low heat emissivity material.

19. The bonding machine of claim 15 wherein the heat resistant coating includes a low thermal conductivity material.

20. The bonding machine of claim 15 wherein the heat resistant coating is also applied to the contact region.

* * * * *